(12) United States Patent  (10) Patent No.: US 7,538,597 B2
Kwong et al.  (45) Date of Patent: May 26, 2009

(54) FUSE CELL AND METHOD FOR PROGRAMMING THE SAME

(75) Inventors: David Kwok Kuen Kwong, Fremont, CA (US); Ho Ming Karen Wan, Kowloon (HK); Kam Chuen Wan, Tuen Mun (HK); Chik Wai Ng, Kowloon (HK)

(73) Assignee: Hong Kong Applied Science and Technology Research Institute Co. Ltd., Hong Kong (CN)

( * ) Notice: Subject to any disclaimer, the term of this patent is extended or adjusted under 35 U.S.C. 154(b) by 0 days.

(21) Appl. No.: 11/838,051

(22) Filed: Aug. 13, 2007

(65) Prior Publication Data

US 2009/0045867 A1    Feb. 19, 2009

(51) Int. Cl.
    *H03H 37/76*    (2006.01)
(52) U.S. Cl. .................................... 327/525; 365/225.7
(58) Field of Classification Search ......... 327/325–326, 327/525–526; 365/225.7
    See application file for complete search history.

(56) References Cited

U.S. PATENT DOCUMENTS

| | | | |
|---|---|---|---|
| 5,748,031 A * | 5/1998 | Best ........................... | 327/525 |
| 6,249,478 B1 * | 6/2001 | Sugiyama .............. | 365/230.06 |
| 6,654,304 B1 | 11/2003 | Huang | |
| 6,728,158 B2 * | 4/2004 | Takahashi et al. ......... | 365/225.7 |
| 6,819,160 B2 * | 11/2004 | Saitoh ........................ | 327/525 |
| 6,949,971 B2 | 9/2005 | Jang | |
| 7,119,414 B2 | 10/2006 | Hisaka | |
| 7,119,603 B2 | 10/2006 | Newman | |
| 7,403,061 B2 * | 7/2008 | Barwin et al. ............... | 327/525 |

\* cited by examiner

*Primary Examiner*—Dinh T. Le
(74) *Attorney, Agent, or Firm*—Pearl Cohen Zedek Latzer, LLP (57) ABSTRACT

The fuse cell architecture 371 for the presently claimed invention employs a multiple fuse structure 301, 302 architecture in lieu of a single fuse structure. As such, the terminals of these fuse structures that couple to other on-chip devices are always at ground potential throughout the application of programming voltage to the fuse pads 311. This approach overcomes previous single fuse problems owing to the fact that a sufficiently high programming voltage can be applied to blow fuse structures with unexpectedly high resistance without damaging nearby on-chip devices. Furthermore, even if one of the fuse structures 301, 302 possessed an abnormally high resistance which would not be blown under typical conditions, the desired circuit trimming result can still be achieved owing to the blowing of the other fuse structure in the fuse cell 371.

19 Claims, 11 Drawing Sheets

FUSE CELL AND METHOD FOR PROGRAMMING THE SAME

FIELD OF THE INVENTION

The present invention relates generally to programmable passive components in integrated circuits (IC) and in particular to fuses.

BACKGROUND

In a number of applications for precision analog circuits, such as converters or precision voltage references, the absolute-value tolerances of circuit components such as resistance are important. However, it is difficult to guarantee absolute-value tolerances associated with semiconductor or thin-film resistors due to unpredictable variations in manufacturing process steps. Additional steps must be taken to trim the on-chip resistor network after its fabrication, to meet a given absolute-value tolerance. One common adjustment method is by the use of fusible links.

A fuse can simply be a short section of minimum-width metal or polysilicon connected between two bond pads. It is programmed or blown, by passing a large current between the bond pads, causing the fuse material to vaporize. After programming, the fuse becomes an open circuit.

Several fuses in combination provide additional trimming resolution. In a typical voltage trimming across a resistor, the resistors are connected in series for binary-weighted adjustment. These links initially short-circuit all the taps together, but they can be selectively open-circuited by blowing them.

One typical application of voltage trimming is the output voltage adjustment for Low Dropout Voltage Regulator (LDOR). Output accuracy is a stringent requirement for LDOR, and the output voltage Vout is usually directly proportional to the reference voltage Vref. Thus, it is necessary to minimize the error in Vref to maintain the precision for Vout. Vref is usually a band-gap reference voltage and better accuracy of Vout can be achieved by resistor trimming.

Figure 1:
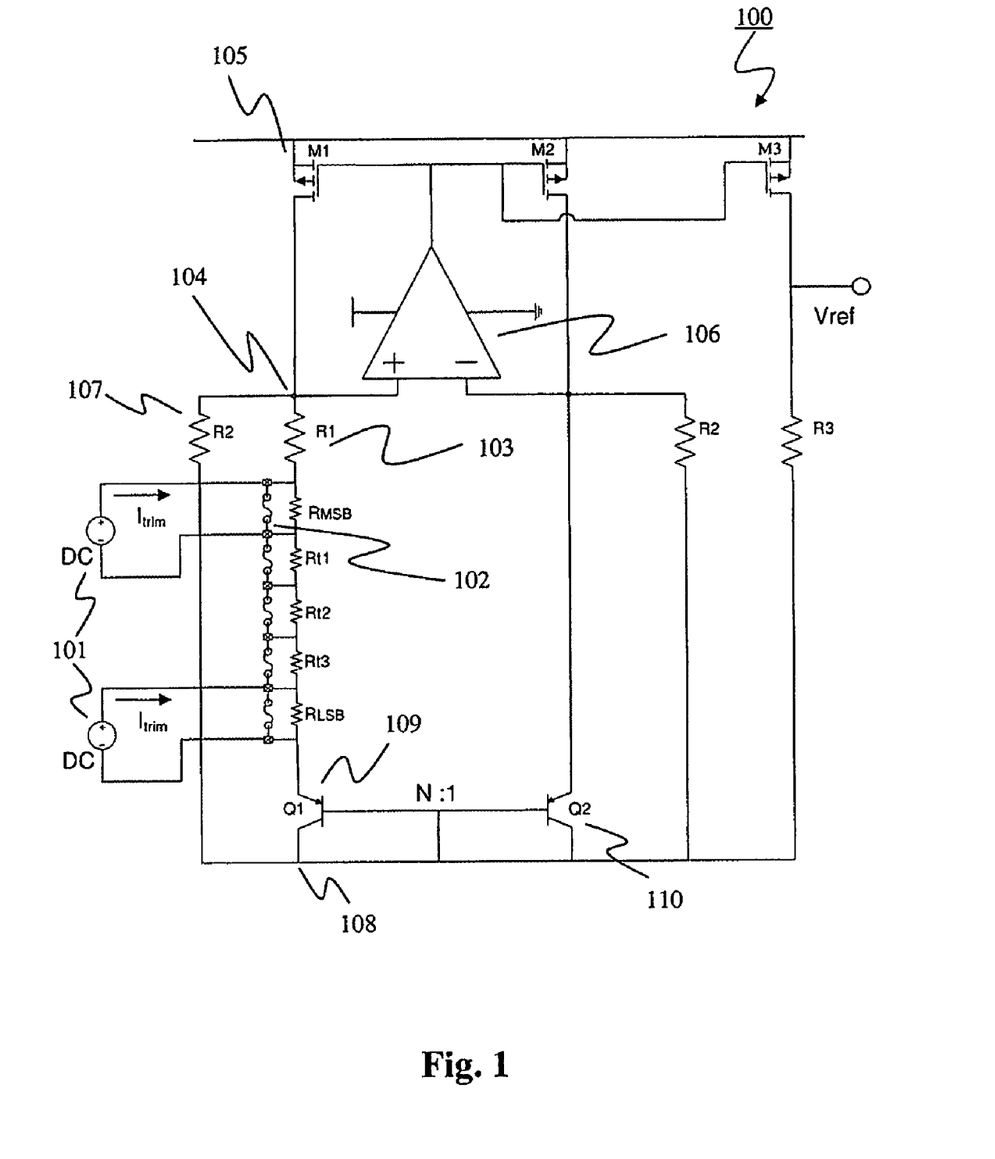
FIG. 1 shows a conventional fuse structure for LDOR bandgap circuit trimming.

FIG. 1 shows a trimming circuit 100 applying conventional fuse structure to Vref trimming for bandgap reference circuit to compensate for the device parameter variation due to manufacturing process. Vref is governed by the equation:

$$Vref = \left(\frac{R3}{R2}\right)\left[Veb1 + \left(\frac{R2}{R1}\right)\ln(N) \times Vt\right]$$

Where Veb1 is the base emitter voltage of pnp 109;
  Vt is the thermal voltage which equals to kT/q;
  k=Boltzmann's constant;
  T=absolute temperature; and
  q=electronic charge;

Therefore, one of the parameters that can be varied on chip to alter the Vref value is the resistance R1.

When Vref measured at the wafer level is different from the desired value, fuses are selectively blown by applying voltage across them, thus adjusting the overall resistance to fine tune Vref accuracy.

In FIG. 1, all fuses initially are conductive and the resistor network has an overall resistance close to R1. Assuming the resistor network is required to be trimmed to an additional resistance of $R_{MSB}$, the fuse 102 in parallel with resistor $R_{MSB}$ has to be blown. This can be performed by applying a high voltage source 101 to pads across fuse 102 and hence a high current flowing through fuse 102 to blow it.

The major drawback of existing structure and method is yield loss due to stress to on-chip active devices. Due to process variation, the resistance of the fuse fabricated may happen to be higher than expected and the conventional method may not be able to supply sufficient power to cut the fuse. Even higher voltage may be used to ensure the fuses are blown. However, the on-chip circuitry coupling to the fuses is also exposed to such extraordinarily high voltage that may cause damage to the circuitry, especially the active devices.

In the foregoing example, the high voltage applying across fuse 102 propagates to node 104 through resistor 103, inducing over-voltage stress on all devices connecting to node 104, including transistor 105 and comparator 106. In addition, the high voltage further propagates through resistor 107 to node 108 if resistance is not large enough. Accordingly, devices 109, 110 connecting to node 108 may also be vulnerable to the high voltage. Either the voltage is not high enough to blow the fuse, or the voltage is too high and damages the on-chip devices, both eventually result in substantial yield loss in mass production.

Consequently, a need exists for an improved fuse cell and programming method that can avoid the fuse unintentionally remaining intact and circuits damaging by programming voltage.

DISCLOSURE OF THE INVENTION

It is a primary object of this invention to overcome the shortcoming of known existing fuse structures and trimming methods and provide improved fuse structures and methods of programming the same that reduce the yield loss of IC caused by fuse intact and over-voltage stress on other on-chip devices in IC.

The claimed invention relates to integrated circuit fuse architectures for semiconductors as well as a related method of trimming for improving manufacture yield loss. Previously in programming fuse-based trimming circuit, a high programming voltage is applied directly across fuse pads to blow the fuse structures. The programming voltage may range from 3V up to 20V depending on the fuse material and the current required to blow the fuse. However, the on-chip devices that are coupled to such fuse pads are also exposed to such a high programming voltage. Consequently, it happens that some of the on-chip devices, especially active devices such as transistors, comparators or operational amplifiers, are damaged by the over-voltage stress. Existing solutions to the over-voltage stress problem is to blow fuses with programming voltages as low as possible. Unfortunately, it leads to another problem that some fuse structures remain intact and the resulting integrated circuits are not correctly trimmed. This is due to manufacturing process variation or device failure that results in unusually high resistances of these fuse structures. A marginal programming voltage is often not sufficiently high to blow these fuse structures. Consequently, the erroneously trimmed integrated circuits cause mass production yield loss and hence increase the production costs.

To overcome the problems of over-voltage stress as well as circumstances where the resistance of the fuse fabricated may happen to be higher than expected and the conventional method may not be able to supply sufficient power to cut the fuse, the claimed and related device of the invention addresses these and other problems through a novel architecture and related method of application to avoid the substantial mass production yield loss associated with previously known conventional methods.

The fuse cell architecture for the presently claimed invention employs a multiple fuse structure architecture in lieu of a single fuse structure. As such, the terminals of these fuse structures that couple to other on-chip devices are always at ground potential or a potential substantially lower than the programming voltage throughout the application of programming voltage to the fuse pads such that the programming voltage does not damage the on-chip devices. This approach overcomes previous single fuse problems owing to the fact that a sufficiently high programming voltage can be applied to blow fuse structures with unexpectedly high resistance without damaging nearby on-chip devices. Furthermore, even if one of the fuse structures possessed an abnormally high resistance which would not be blown under typical conditions, the desired circuit trimming result can still be achieved owing to the blowing of the other fuse structure in the fuse cell.

Through the foregoing arrangement, improved integrated circuit fuse cell architectures providing higher production yield in mass production are realised.

Other aspects of the invention are also disclosed.

BRIEF DESCRIPTION OF THE DRAWINGS

Embodiments of the invention are described hereinafter with reference to the drawings, in which:

FIG. 2b depicts a flow diagram illustrating the steps in programming the fuse cell in FIG. 2a;

FIG. 3b is a flow diagram illustrating the steps in programming the fuse chain in FIG. 3a;

DETAILED DESCRIPTION

The present invention is described in detail herein in accordance with certain preferred embodiments thereof. To describe fully and clearly the details of the invention, certain descriptive names were given to the various components. It should be understood by those skilled in the art that these descriptive terms were given as a way of easily identifying the components in the description, and do not necessary limit the invention to the particular description.

Figure 2A:
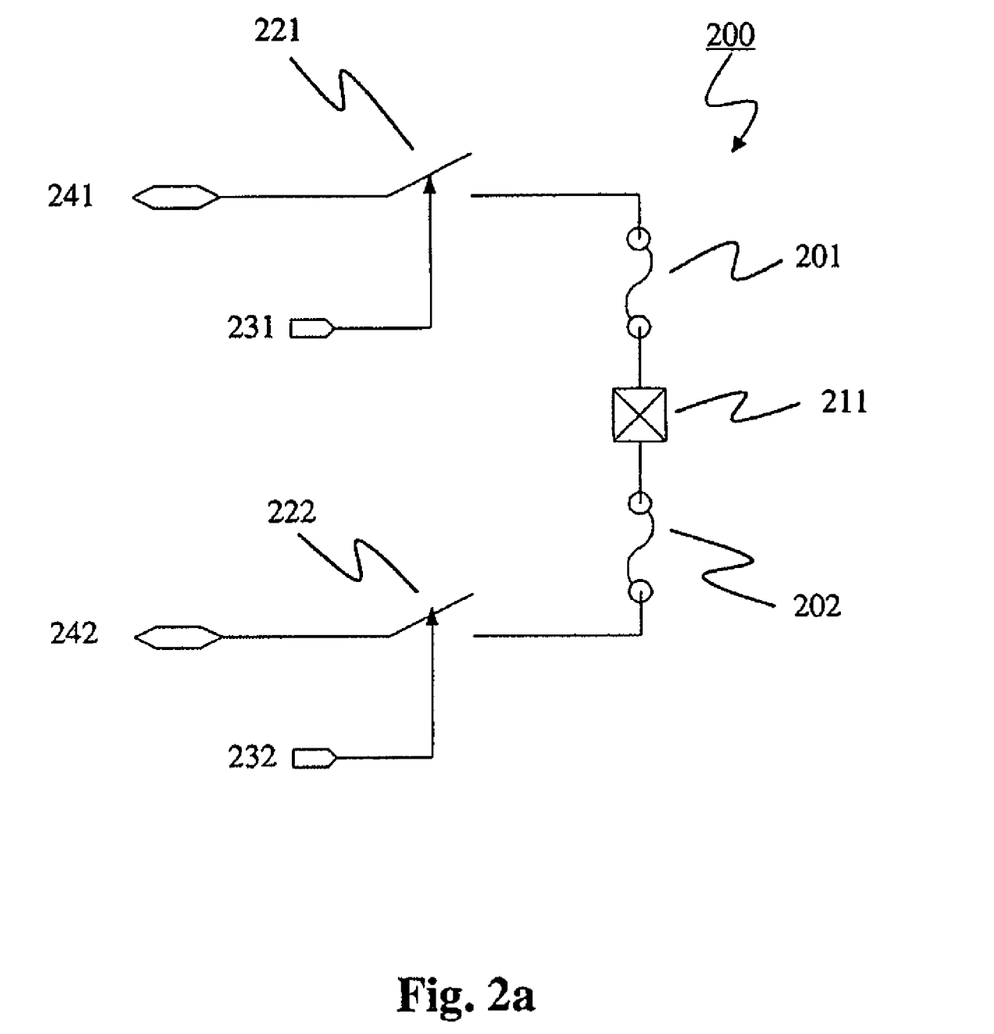
FIG. 2a is a schematic diagram illustrating a fuse cell according to an embodiment of the present invention.

FIG. 2a shows a schematic diagram illustrating a fuse cell 200 according to an embodiment of the present invention. Instead of conventional configuration having a single fuse structure, the fuse cell 200 consists of two fuse structures 201, 202 connected in series. A programming node 211, usually in the form of a fuse pad, is disposed at the common end of the fuse structures 201, 202 for application of external programming voltage. Alternatively, the programming voltage is generated by on-chip circuit and the programming node 211 is connected to the output of the voltage generation circuit. The programming voltage is usually chosen from 3V to 20V according to the fuse material and the current required to blow the fuse.

The opposite ends of the fuse structures 201, 202 form the terminals of the fuse cell 200 and are connected respectively to switches 221, 222. Each switch can be turned on or off by assertion of control signal at terminal 231 and 232. The switches 221, 222 are further connected to nodes 241, 242 providing a reference potential, usually the ground. Through the corresponding switches 221, 222, the fuse structures 201, 202 can be connected to or disconnected from the terminals 241, 242 of reference potential.

Figure 2B:
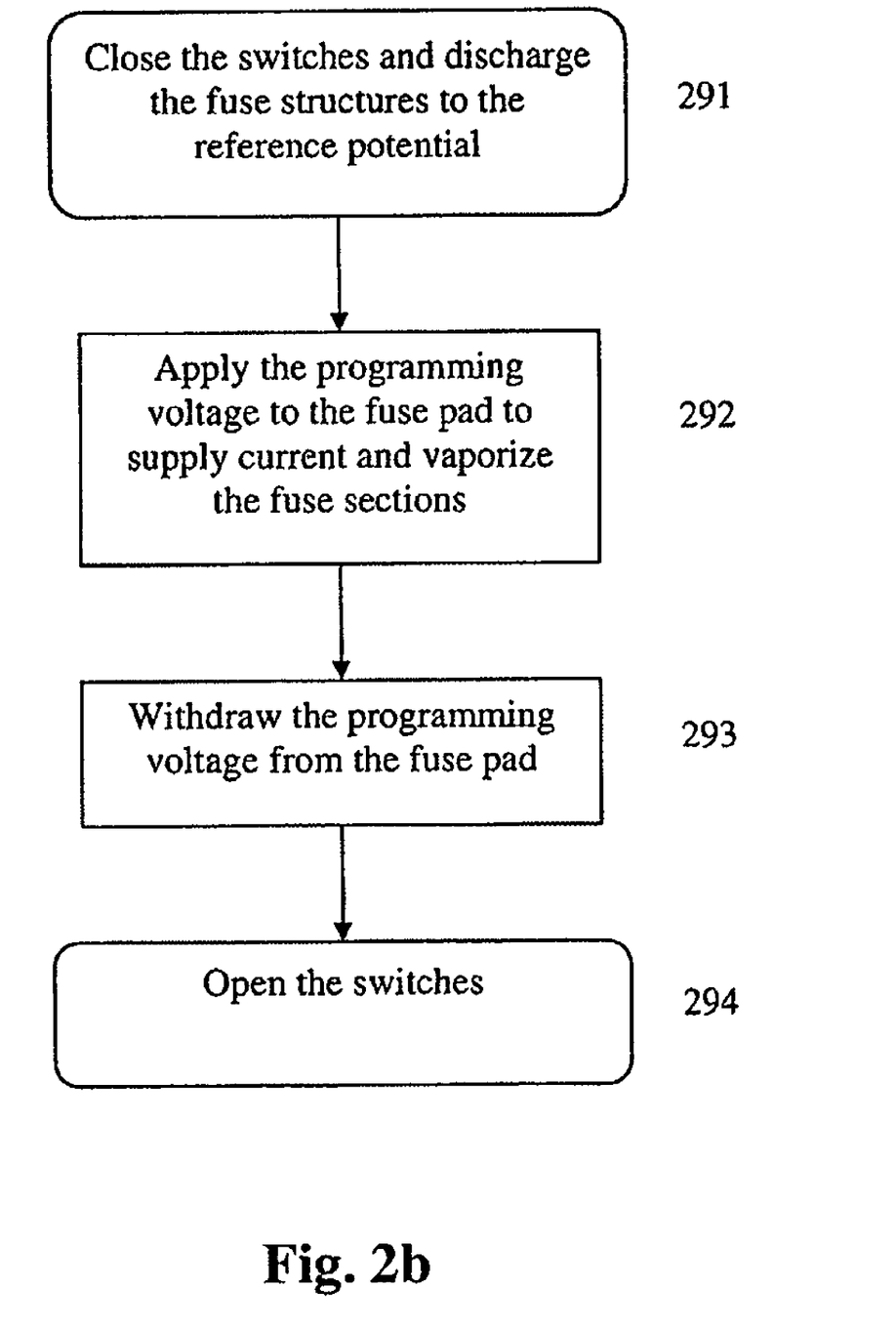

FIG. 2b is a flow diagram illustrating the steps in programming the fuse cell in FIG. 2a. Processing commences in step 291, where the switches of the fuse cell are closed and the opposite ends of the fuse structures are discharged to the reference potential.

In step 292, the programming voltage, a high voltage for programming the fuse cell, is applied to the fuse pad. The voltage difference between the programming voltage and the reference potential results in a current conducting through both the fuse structures. When such current is large enough, it heats up the fuse structure and blows it.

In step 293, the programming voltage is withdrawn or removed from the fuse pad. Subsequently in step 294, the switches are opened to disconnect the fuse structures from reference potential.

The ordering of the steps is important such that the opposite ends of the fuse structures or the terminals of the fuse cell are either floating or close to the reference potential throughout the programming process.

Figure 3A:
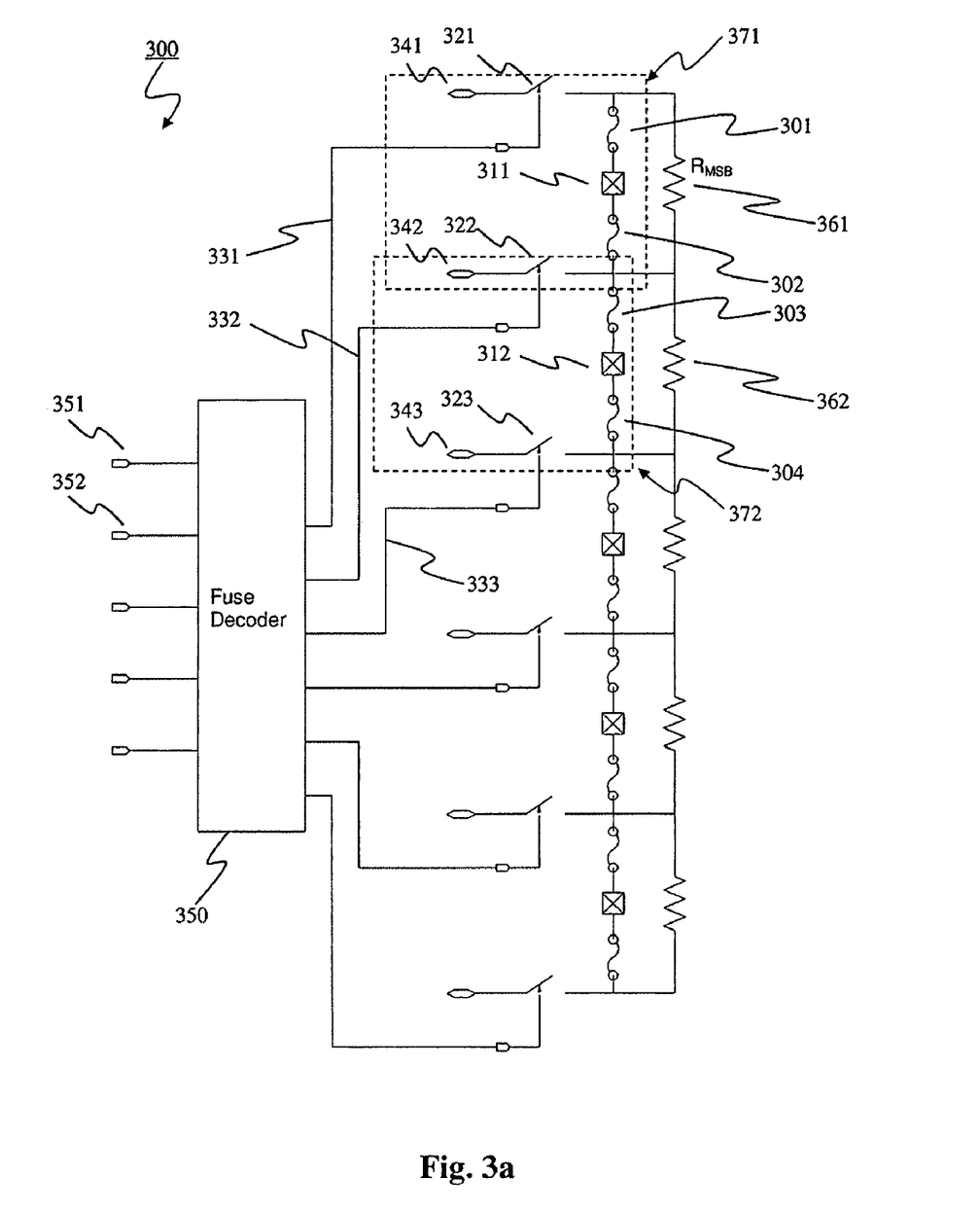
FIG. 3a is a fuse chain formed by connecting the fuse cells in FIG. 2a in series configuration.

FIG. 3a is a fuse chain 300 based on the fuse cell in FIG. 2a, wherein several fuse cells are connected together in series configuration for trimming a binary-weighted resistor. Each resistor 361, 362 of corresponding binary-weighted resistor value for trimming is connected in parallel with a fuse cell 371, 372, with component terminals connecting respectively to the terminals of corresponding fuse cell. Each fuse cell has a similar architecture as described in FIG. 2a, consisting of a pair of fuse structures 301 and 302, 303 and 304 with a common end connecting to the respective fuse pad 311, 312. The other ends of the fuse structures 301, 302, 303, 304 are selectively connected to reference potential terminals 341, 342, 343 through switches 321, 322, 323. Such switches 321, 322 are controlled by signals at paths 331, 332 outputted from fuse decoder 350, and are shared among adjacent fuse cells. The decoder 350 operates in such a way that when any desired fuse cells 371, 372 are required to be programmed, the corresponding input signals 351, 352 to the fuse decoder 350 are asserted. The fuse decoder 350 then output control signals at paths 331, 332, 333 to turn on the switches 321, 322, 323 of the corresponding fuse cells 371, 372.

Figure 3B:
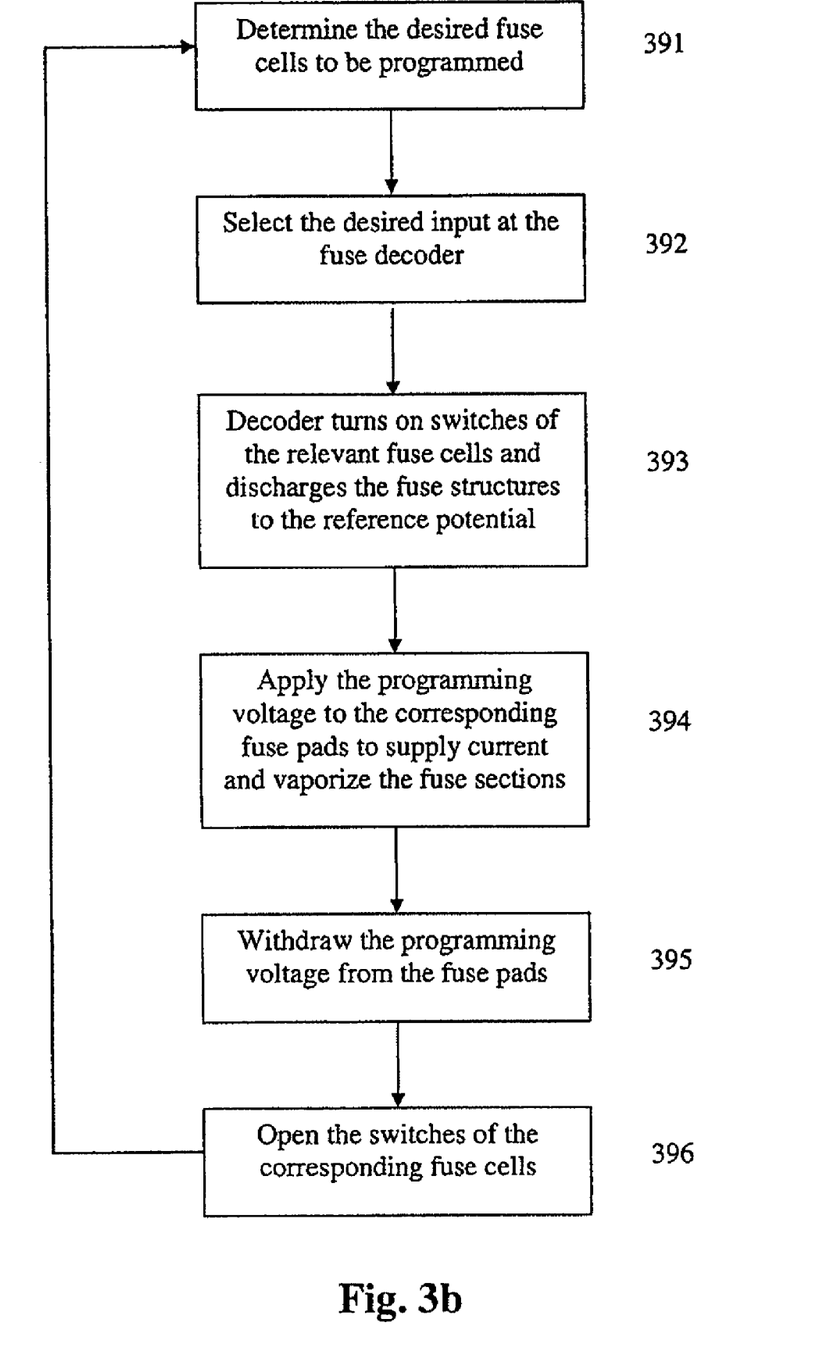

FIG. 3b is a flow diagram illustrating the steps in programming the fuse chain in FIG. 3. Processing commences in step 391, wherein the desired fuses to be programmed are determined. This may depend on the desired value of a resistor network, or the desired option settings. In step 392, the fuse decoder inputs corresponding to the fuse to be programmed are asserted. The assertion of the input signals can be driven by external voltage through I/O pads, or by internal circuit which controls the programming based on data processing.

In step 393, the decoder sends control signals to turn on switches of the relevant fuse cells. As such, the terminals of these fuse cells are connected to reference potential to get ready for fuse blowing. In step 394, programming voltage is applied to the fuse pad and causes current flow through the fuse structures and vaporizes the same. The programming voltage should be sufficiently higher than the voltage reference in order to deliver a sufficiently large current to blow the fuse structures.

In step 395, the programming voltage is withdrawn from the fuse pad. Thereafter in step 396, the switches are opened to disconnect the fuse structures from reference potential. Until then, the fuse cell terminals are always connected to the reference potential throughout the programming of the fuse cell.

Similar to the flow described in FIG. 2a, the ordering of the steps in FIG. 3b is important such that the opposite ends of the fuse structures or the terminals of the fuse cell are either floating or connected to the reference potential from step 393 to 395.

Figure 4:
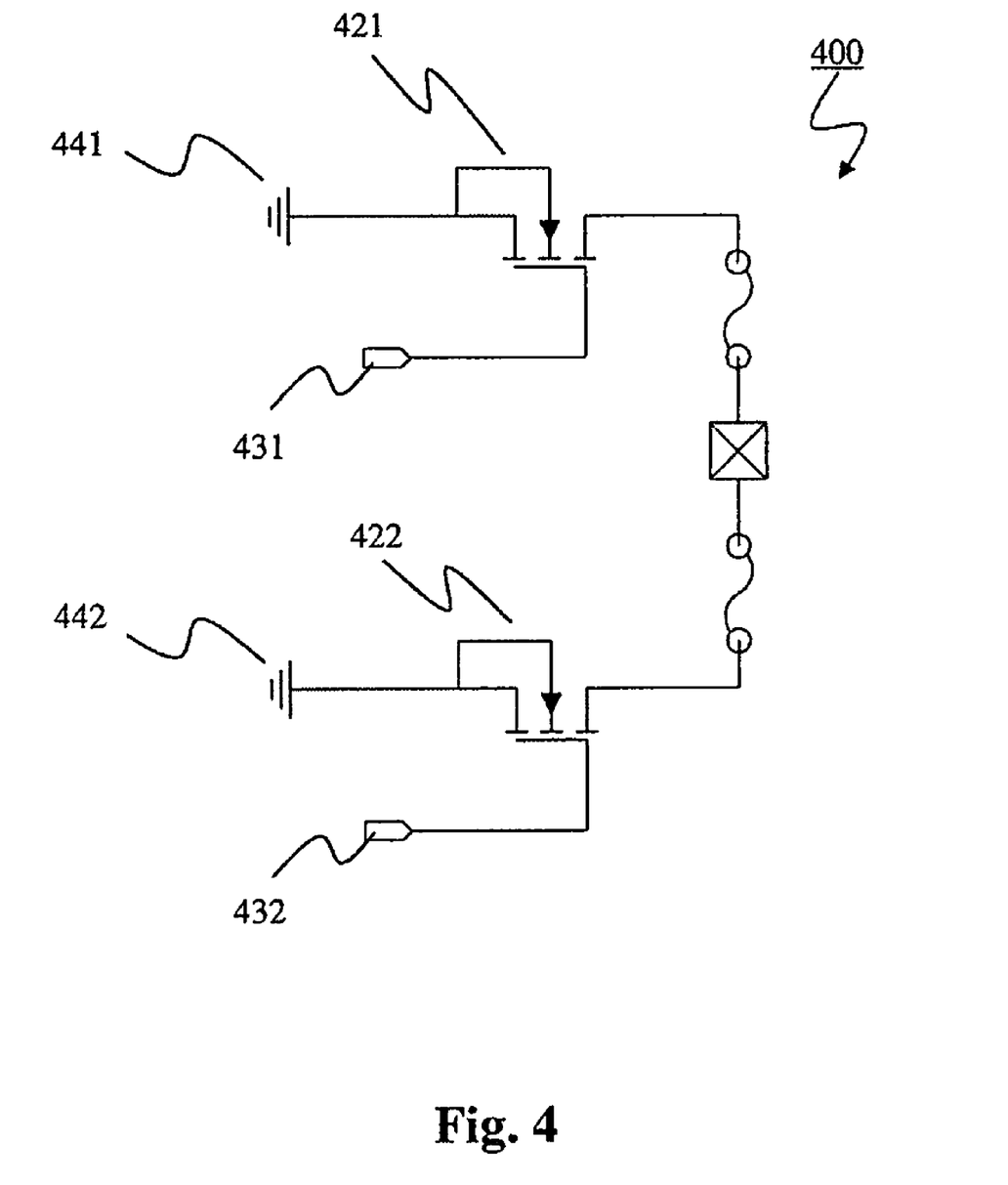
FIG. 4 is a schematic diagram illustrating a fuse cell according to another embodiment of the present invention.

The switches in fuse cells according to the invention can be implemented by transistor devices such as bipolar junction transistors (BJT), field-effect transistors (FET), junction FET (JFET), insulated gate FET (IGFET), metal-oxide-semiconductor FET (MOSFET), or circuits that perform switching and offer low turn-on resistance. Switches are usually chosen based on the integrated circuit fabrication process, turn-on resistance, switching speed and layout size. FIG. 4 shows a schematic diagram illustrating fuse cell circuit 400 as an example of the fuse cell in FIG. 2 utilizing n-channel MOSFET (NMOS) 421, 422 as the fuse cell switches. The NMOS 421, 422 are turned on when the corresponding gate voltage 431, 432 is higher than the threshold voltage, and thereby connect the fuse structures to ground 441, 442.

Figure 5:
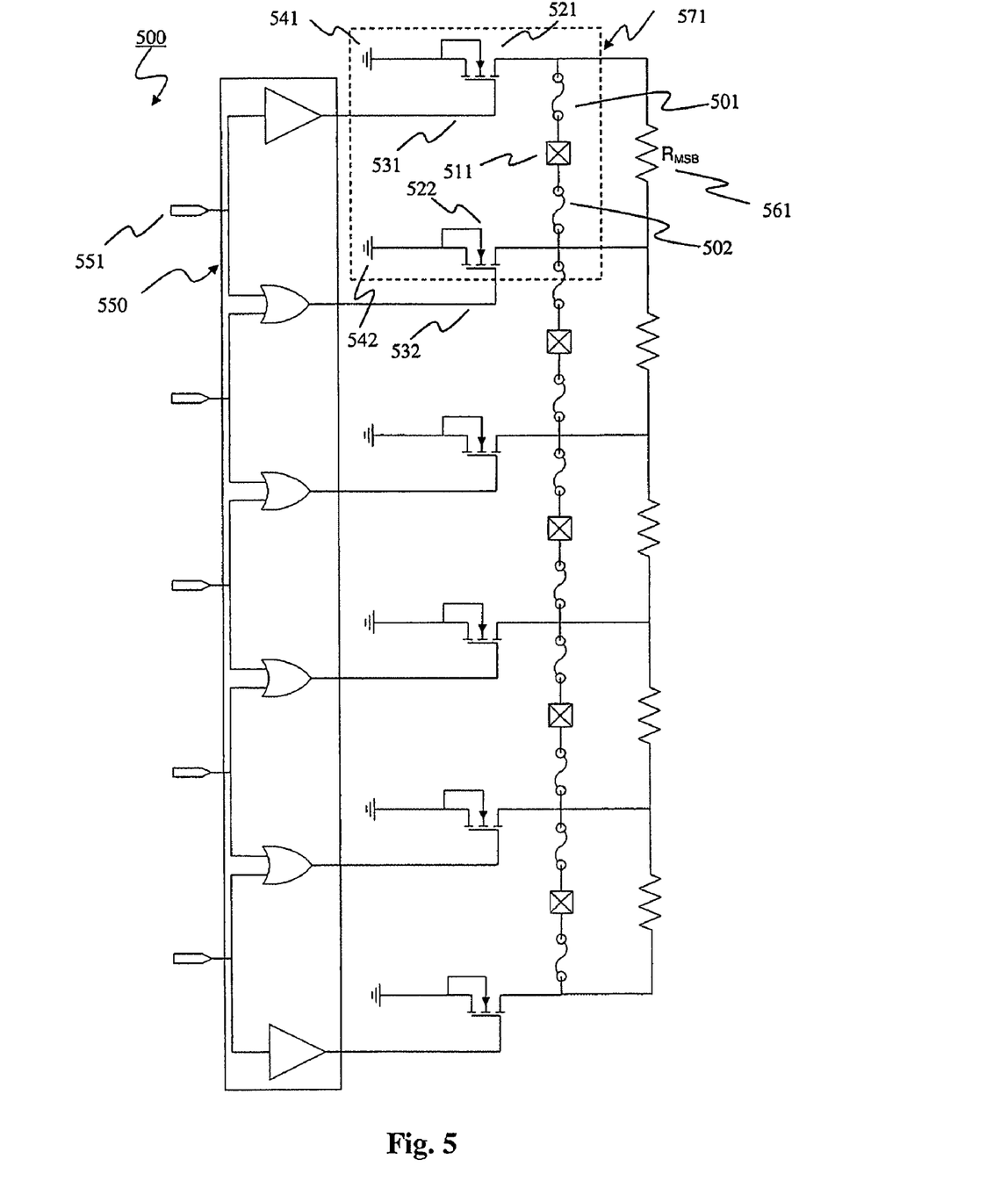
FIG. 5 is a fuse chain formed by connecting the fuse cells in FIG. 4 in series configuration.

FIG. 5 shows a trimming circuit 500 as an example of the fuse chain in FIG. 3 that utilizes the fuse cell in FIG. 4. When it is required to trim the resistor network to exhibit a resistance of $R_{MSB}$, for example, the fuse cell 571 in parallel with resistance $R_{MSB}$ 561 should be programmed. The programming process is same as described in FIG. 3. Specifically, the switching action of the NMOS transistors is determined by the trimming control signal entering fuse decoder 550.

To program the fuse cell for $R_{MSB}$, the trimming control signal at decoder input 551 is given a high voltage while other inputs of the decoder remain at low voltage. The fuse decoder 550 processes the trimming control signals with its decoding logic composing OR-gates, buffers and outputs a high voltage at signals at paths 531 and 532 which connect to the gate terminal of the respective NMOS transistors 521, 522, and turn on the same. In the meantime, the other NMOS transistors in the fuse chain stay in switch-off state. The programming voltage is then applied to fuse pad 511 to cause current flowing through fuse structures 501, 502 to ground nodes 541, 542.

After blowing off the fuse structures 501, 502 and the programming voltage on fuse pad 511 is withdrawn, the trimming control signal 551 is given a low voltage. As a result, the signals at paths 531, 532 become low and turn off the NMOS transistors 521, 522.

Figure 6:
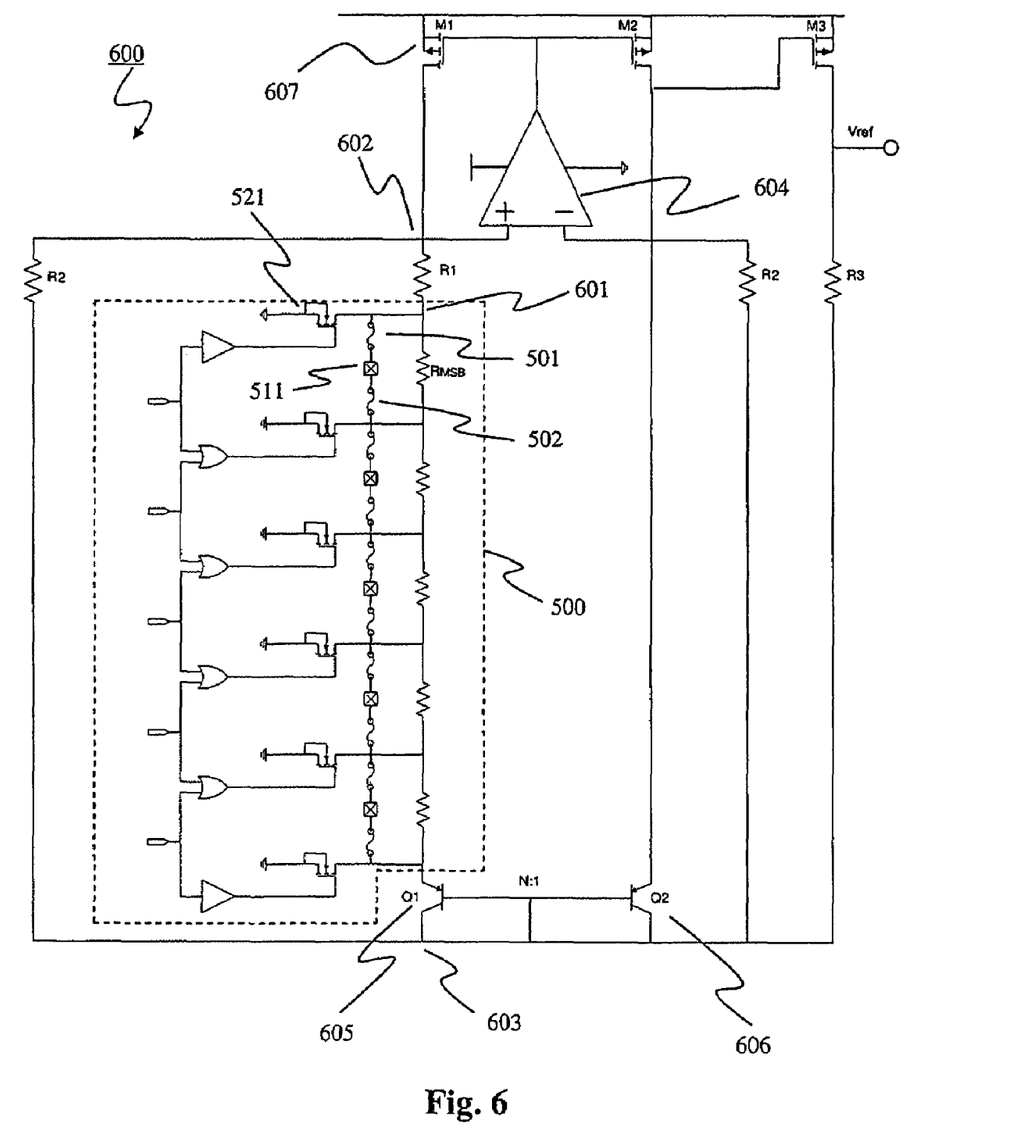
FIG. 6 is a schematic diagram illustrating the application of the fuse chain in FIG. 5 for circuit trimming.

FIG. 6 shows a schematic diagram of a trimming circuit 600 illustrating the application of the fuse chain in FIG. 5 for trimming the bandgap reference in the LDOR in FIG. 1. In the situation when fuse structures 501 and 502 are required to be blown, NMOS transistor 521 is always switched on as long as the programming voltage is applied to fuse pad 511. Accordingly, only the fuse pad 511 is exposed to the high programming voltage, whereas node 601 remains close to the reference potential, so do nodes 602 and 603. Therefore, active devices around the trimming circuit such as 604, 605 and 606, 607 are prevented from over-voltage hazard.

In addition, a higher programming voltage can be applied to ensure the desired fuse structures are blown, without exposing other part of the integrated circuit to over-voltage stress.

Figure 7:
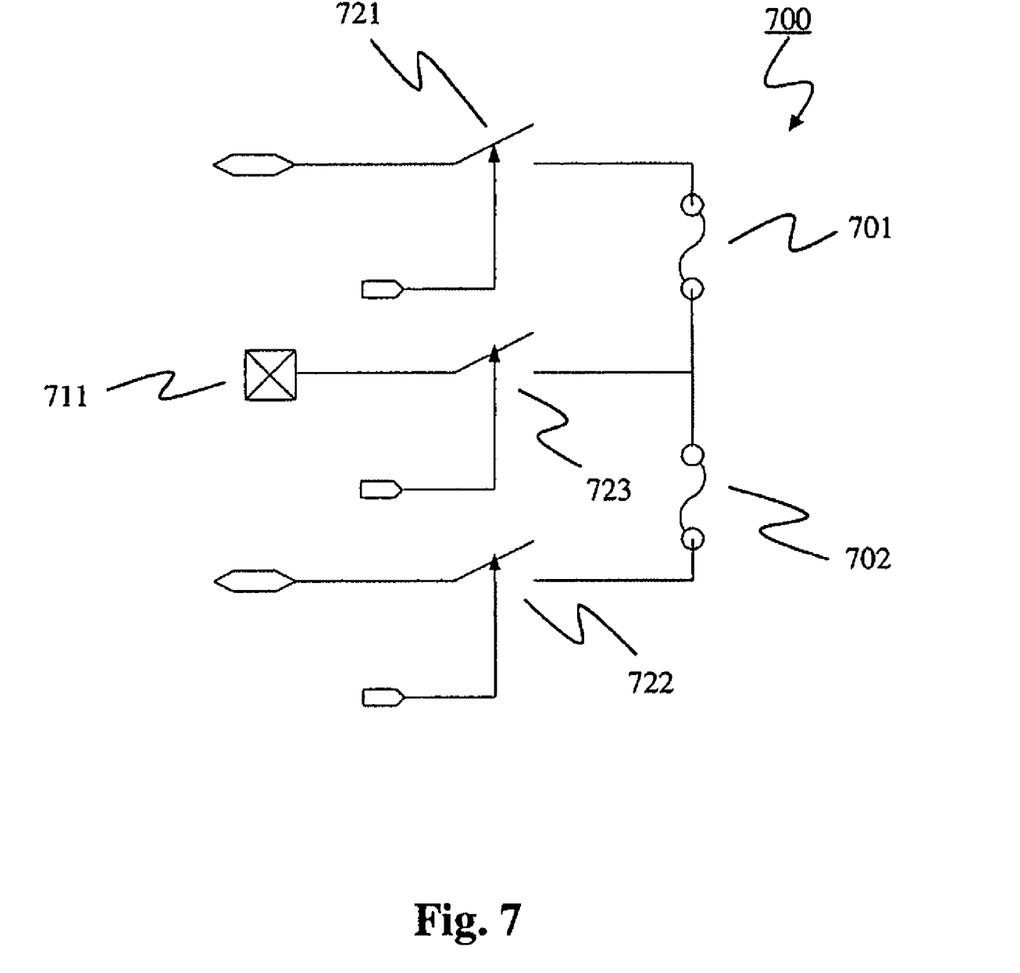
FIG. 7 is a schematic diagram illustrating a fuse cell according to a further embodiment of the present invention.

FIG. 7 shows the fuse cell 700 architecture in accordance with another embodiment of the present invention. The architecture is modified from FIG. 2 by inserting an additional switch 723 between the fuse pad 711 and the common node of fuse structures 701 and 702. The fuse cell is programmed by firstly closing the switches 721, 722, 723, following by the application of programming voltage on the fuse pad 711. Unless switch 723 is designed for high voltage operation, it must be closed before applying programming voltage to the fuse pad 711. Otherwise, the switching action under high programming voltage may damage or zap the switch 723.

After the fuse structures 701 and 702 are blown, the programming voltage is withdrawn from the fuse pad 711. The switches 721, 722, 723 are subsequently opened to finish the programming flow.

Figure 8:
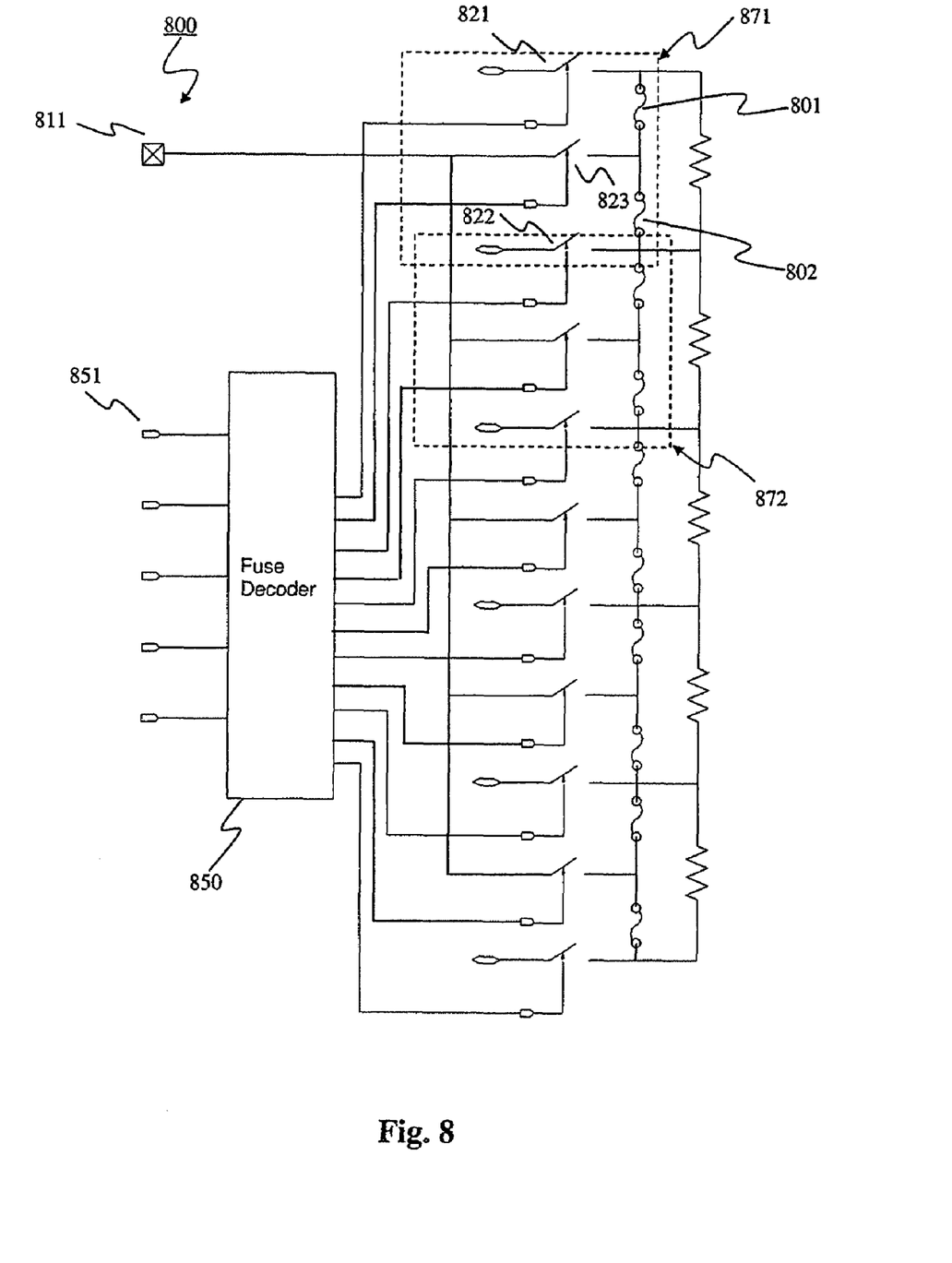
FIG. 8 depicts a fuse chain formed by connecting the fuse cells in FIG. 7 in series configuration.

FIG. 8 shows the application of the fuse cell architecture in FIG. 7 to a fuse chain 800. The fuse chain 800 is constructed by connecting fuse cells such as 871 and 872 in series. The flow of current through each individual fuse cell, for example 871, is controlled by the on/off state of corresponding switches 821, 822 and 823. The programming of the fuse chain is realized by initially selecting the input pins, for example 851, of the fuse decoder 850 such that the switches 821, 822, 823 of the desired fuse cell 871 are closed. The programming voltage is then applied to a single fuse pad 811 even if more than one fuse cell are to be programmed. Once the desired fuse structures 801, 802 are blown, the programming voltage is removed from the fuse pad 811. Thereafter, the input 851 of the fuse decoder 850 is deselected to open the fuse cell switches 821, 822, 823. The fuse cell 871 architecture of the embodiment provides the advantage that a single fuse pad 811 can serve the whole fuse chain. Hence, the die size and the number of pins required by the fuse chain trimming circuit can be substantially reduced.

According to a further embodiment of the invention, variation of the fuse cell architecture is made to adapt for antifuse application. In contrast with a fuse, an antifuse provides a high resistance upon fabrication and permanently creates an electrically conductive path after programming. An example of conventional antifuse is a thin barrier of non-conducting amorphous silicon between two antifuse pads made of metal conductors. The antifuse initially provides a high resistance due to the amorphous silicon.

To program the antifuse, a programming voltage is applied across the amorphous silicon which is sufficiently high to turn the amorphous silicon into a polycrystalline silicon-metal alloy forming a conductive path of a few hundreds ohms. Similar problems occur during the course of programming the foregoing antifuse architecture as in programming a conventional fuse. The on-chip devices near the programming pads where high programming voltage is applied are vulnerable to damage. If marginal programming voltage is used for programming, the current passing through some antifuse of exceptionally high resistance may not be large enough to convert the amorphous silicon barrier into a polycrystalline silicon-metal alloy. Either the damage to on-chip devices or failure in antifuse programming causes low production yield.

Figure 9:
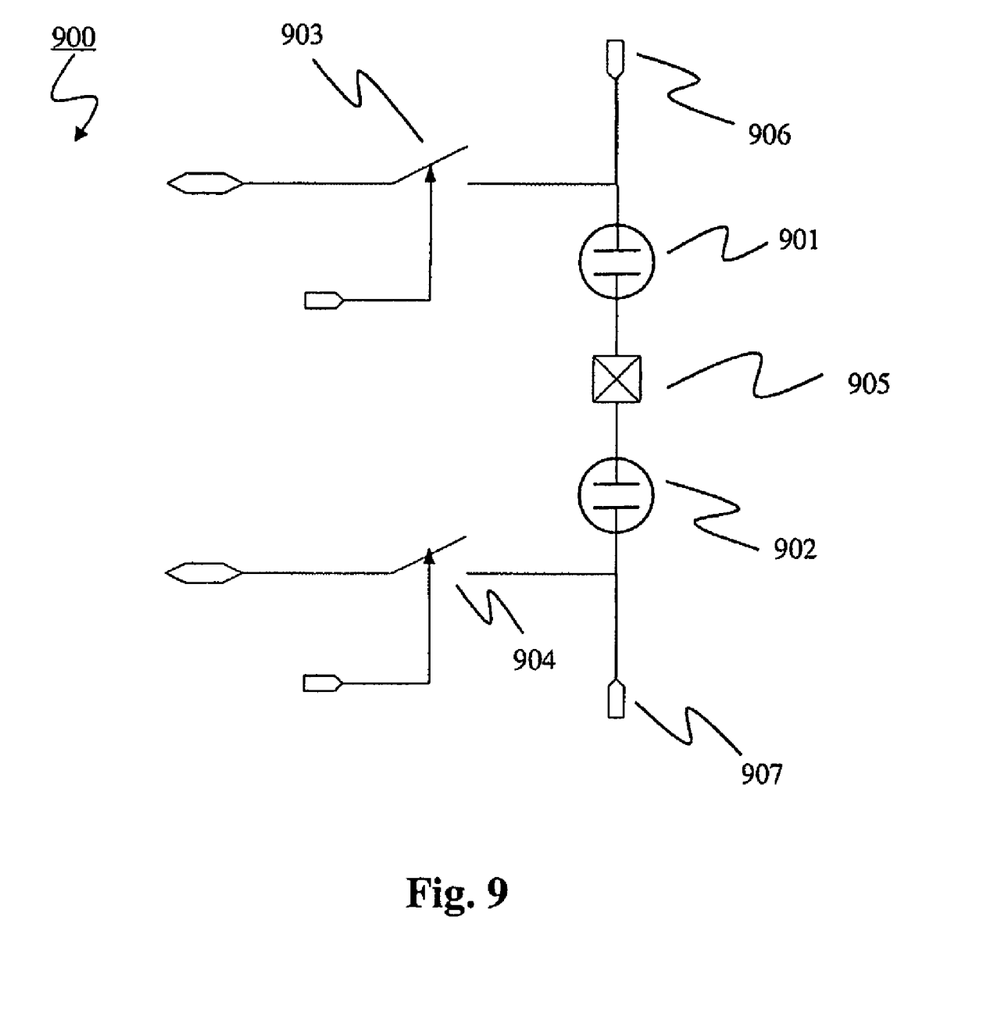
FIG. 9 is a schematic diagram illustrating an antifuse cell according to a further embodiment of the present invention.

FIG. 9 shows an antifuse cell 900 in accordance with a further embodiment of the invention. The fuse structures in the fuse cell of FIG. 2 are now replaced by antifuse structures 901, 902. The programming method for the antifuse cell 900 is the same as programming the fuse cell in FIG. 2. Switches 903, 904 are always closed when the programming voltage is applied at the antifuse pad 905. As such, the antifuse cell terminals 906, 907 connecting to other on-chip devices are always kept to the reference voltage all through the programming process.

Accordingly, all fuse structures in the fuse cell architecture of various embodiments hereinbefore described can be replaced by antifuse structures.

The above described fuse cell structure and methods for programming the same are able to prevent circuit around fuse network from a high voltage stress in the programming process. This offers an advantage to allow higher programming voltage to be used in order to avoid fuse structure remaining intact. Hence the success rate in blowing the fuse structures can be increased. The foregoing advantages therefore can achieve a higher production yield than conventional fuse trimming technology. This invention is especially useful when a low cost wafer trimming solution is required.

INDUSTRIAL APPLICABILITY

The arrangements described are applicable to the integrated circuit industries and particularly for circuits that require analog or digital parameter trimming, including bandgap reference circuits, ring oscillators, memory devices, one-time programmable devices (OTP), field-programmable gate array (FPGA), programmable array logic (PAL), programmable logic device (PLD).

The foregoing describes only some embodiment of the present invention, and modifications and/or changes can be made thereto without departing from the scope and spirit of the invention, the embodiments being illustrative and not restrictive.

We claim:

1. A fuse cell in integrated circuit, comprising:
   a first fuse structure and a second fuse structure in series configuration;
   a programming node coupled to the common end of said first fuse structure and said second fuse structure;
   a resistor coupled in parallel between the opposite ends of said first fuse structure and said second fuse structure; and
   a first switch and a second switch respectively coupling the other ends of said first fuse structure and said second fuse structure to a voltage reference;
   said fuse cell is operable to be blown by closing said first switch and said second switch and applying subsequently a programming voltage to said programming node and said resistor.

2. The fuse cell in accordance with claim 1, wherein said programming node is coupled to fuse pad for application of external programming voltage.

3. The fuse cell in accordance with claim 2, further comprising a third switch for coupling said programming node to said fuse pad.

4. A fuse chain of a plurality of fuse cells in accordance with claim 3, wherein said third switches couple a corresponding programming node of each said fuse cell to one or more fuse pads.

5. The fuse cell in accordance with claim 1, wherein said programming node is coupled to output of on-chip circuit that generates programming voltage.

6. A fuse chain of a plurality of fuse cells in accordance with claim 1, further comprising one or more logic circuits to control said first switch and said second switch for selecting desired fuse cell to be blown.

7. The fuse cell in accordance with claim 1, wherein said first fuse structure and said second fuse structure are selected from the group of structures consisting of: poly-silicon fuse, single metal fuse and fusion-type metal fuse.

8. The fuse cell in accordance with claim 1, wherein said first switch and said second switch are switching circuits comprising electronic devices selected from the group consisting of: bipolar junction transistors (BJT), field-effect transistors (FET), junction FET (JFET), insulated gate FET (IGFET), and metal-oxide-semiconductor FET (MOSFET).

9. The fuse cell in accordance with claim 1, wherein said voltage reference is a substrate of said integrated circuit.

10. An integrated circuit for circuit parameter trimming, comprising:
    a first fuse structure and a second fuse structure in a series configuration;
    a programming node coupled to the common end of said first fuse structure and said second fuse structure;
    a resistor coupled in parallel between the opposite ends of said first fuse structure and said second fuse structure; and
    a first switch and a second switch respectively coupling the other ends of said first fuse structure and said second fuse structure to a voltage reference;
    at least one circuit component connected in parallel with said series configuration of said first fuse structure and said second fuse structure;
    wherein in use, said first and second fuse structure are blown by closing said first switch and said second switch and applying subsequently a programming voltage to said programming node such that said integrated circuit exhibits substantially the electrical characteristics of said circuit component.

11. Method for programming one or more fuse cells in integrated circuit, comprising the steps of:
    providing one or more fuse cells each with a first fuse structure and a second fuse structure in series configuration;
    connecting the opposite ends of said first fuse structure and said second fuse structure to a voltage reference;
    coupling the opposite ends of said first fuse structure and said second fuse structure to each end of a resistor;
    applying a programming voltage to the common end of said first fuse structure and said second fuse structure and causing current to flow through said first fuse structure and said second fuse structure to said voltage reference;
    removing said programming voltage from said common end; and
    disconnecting said opposite ends of said first fuse structure and said second fuse structure from said voltage reference.

12. The method of programming fuse cell in accordance with claim 11, wherein said step of applying programming voltage additionally comprises the application of an external programming voltage through a fuse pad.

13. The method of programming fuse cell in accordance with claim 11, wherein said step of applying a programming voltage additionally comprises the application of an internal programming voltage generated by on-chip circuit.

14. The method of programming fuse cell in accordance with claim 11, wherein said step of providing one or more fuse cells further comprises the step of providing at least one circuit component corresponding to each said fuse cell, wherein each said circuit component is in parallel configuration with said corresponding fuse cell for circuit parameter trimming.

15. The method of programming fuse cell in accordance with claim 11, further comprising the step of decoding trimming signals into control signals for controlling said connecting and disconnecting said first fuse structure and said second fuse structure to said one or more fuse cells to the voltage reference.

16. The method of programming fuse cell in accordance with claim 11, wherein said step of connecting the opposite ends of said first fuse structure and said second fuse structure to a voltage reference occurs by way of connecting said opposite ends of said first fuse structure and said second fuse structure to the ground potential.

17. The method of programming fuse cell in accordance with claim 11, wherein said step of applying programming voltage occurs by way of applying a voltage from 3V to 20V.

18. An antifuse cell in integrated circuit, comprising:
- a first antifuse structure and a second antifuse structure in series configuration; a programming node coupled to the common end of said first antifuse structure and said second antifuse structure;
- a resistor coupled in parallel between the opposite ends of said first antifuse structure and said second antifuse structure; and
- a first switch and a second switch respectively coupling the other ends of said first antifuse structure and said second antifuse structure to a voltage reference;

said antifuse cell is operable to be programmed by closing said first switch and said second switch and applying subsequently a programming voltage to said programming node.

19. Method for programming one or more antifuse cells in integrated circuit, comprising the steps of:
- providing one or more antifuse cells each with a first antifuse structure and a second antifuse structure in series configuration;
- connecting the opposite ends of said first antifuse structure and said second antifuse structure to a voltage reference;
- coupling the opposite ends of said first antifuse structure and said second antifuse structure to each end of a resistor;
- applying a programming voltage to the common end of said first antifuse structure and said second antifuse structure and causing current to flow through said first antifuse structure and said second antifuse structure to said voltage reference;
- removing said programming voltage from said common end; and disconnecting said opposite ends of said first antifuse structure and said second antifuse structure from said voltage reference.

* * * * *